(12) United States Patent  (10) Patent No.: US 7,940,558 B2
Slesazeck  (45) Date of Patent: May 10, 2011

(54) INTEGRATED CIRCUIT COMPRISING A THYRISTOR AND METHOD OF CONTROLLING A MEMORY CELL COMPRISING A THYRISTOR

(75) Inventor: Stefan Slesazeck, Dresden (DE)

(73) Assignee: Qimonda AG, Munich (DE)

( * ) Notice: Subject to any disclaimer, the term of this patent is extended or adjusted under 35 U.S.C. 154(b) by 133 days.

(21) Appl. No.: 12/339,722

(22) Filed: Dec. 19, 2008

(65) Prior Publication Data
US 2009/0213648 A1 Aug. 27, 2009

Related U.S. Application Data

(60) Provisional application No. 61/016,094, filed on Dec. 21, 2007.

(51) Int. Cl.
*G11C 11/36* (2006.01)
(52) U.S. Cl. ......... 365/175; 365/174; 365/159; 257/107
(58) Field of Classification Search .................. 365/175, 365/174, 159, 72
See application file for complete search history.

(56) References Cited

U.S. PATENT DOCUMENTS

| | | | | |
|---|---|---|---|---|
| 3,872,493 A * | 3/1975 | Roberts et al. | ................. | 257/171 |
| 6,462,359 B1 * | 10/2002 | Nemati et al. | ................. | 257/107 |
| 6,690,038 B1 * | 2/2004 | Cho et al. | ........................ | 257/133 |
| 6,721,220 B2 * | 4/2004 | Yoon et al. | ..................... | 365/205 |
| 6,735,113 B2 * | 5/2004 | Yoon et al. | ..................... | 365/174 |
| 6,781,888 B1 * | 8/2004 | Horch et al. | ............. | 365/189.09 |
| 6,845,026 B1 * | 1/2005 | Gharia | .......................... | 365/49.1 |
| 6,885,581 B2 * | 4/2005 | Nemati et al. | ................. | 365/159 |
| 6,936,908 B2 * | 8/2005 | Kelberlau et al. | .............. | 257/502 |
| 7,078,739 B1 * | 7/2006 | Nemati et al. | ................. | 257/107 |
| 7,209,384 B1 * | 4/2007 | Kim | ............................. | 365/175 |
| 7,268,373 B1 * | 9/2007 | Gupta et al. | ................... | 257/162 |
| 7,504,286 B2 * | 3/2009 | Cho | ............................ | 438/135 |
| 7,573,077 B1 * | 8/2009 | Ershov | ......................... | 257/146 |
| 7,724,567 B2 * | 5/2010 | Dhong et al. | ................. | 365/175 |
| 7,738,274 B1 * | 6/2010 | Nemati et al. | ............... | 365/49.1 |

OTHER PUBLICATIONS

Hyun-Jin Cho et al., "A novel capacitor-less DRAM cell using Thin Capacitively-Coupled Thyristor (TCCT)," IEEE 2005.

* cited by examiner

*Primary Examiner* — Viet Q Nguyen
(74) *Attorney, Agent, or Firm* — Edell, Shapiro & Finnan, LLC (57) ABSTRACT

An integrated circuit is provided comprising an array of memory cells connected by word and bit lines, respectively, wherein each memory cell comprises a thyristor structure, an anode terminal that connects the thyristor structure with a respective bit line, a gate terminal that connects the thyristor structure with a respective word line, and a cathode terminal. The integrated circuit further comprises a drive/sensing circuitry configured to apply a first sequence of voltage signals at the anode terminal and the gate terminal, wherein the voltage signals are defined with respect to the cathode terminal. The first sequence comprises a first voltage signal at the anode terminal, a second voltage signal at the gate terminal, and thereafter a combination of a third voltage signal at the anode terminal and a fourth voltage signal at the gate terminal, wherein the third voltage signal is lower than the first voltage signal and lower than the fourth voltage signal.

8 Claims, 8 Drawing Sheets

INTEGRATED CIRCUIT COMPRISING A THYRISTOR AND METHOD OF CONTROLLING A MEMORY CELL COMPRISING A THYRISTOR

CROSS REFERENCE TO RELATED APPLICATIONS

This application claims priority under 35 U.S.C. §119(e) from U.S. Provisional Patent Application Ser. No. 61/016,094, filed Dec. 21, 2007, and entitled "Method for Controlling a Memory Cell Comprising a Thyristor Structure," the entire contents of which are hereby incorporated by reference.

BACKGROUND

Floating body memory cells base upon charge storage effects in an insulated floating semiconductor body. The floating body is sandwiched between two regions, wherein a first region may be connected to a source line and a second region may be connected to a bit line. A gate electrode is configured to switch a current between the two regions by a select voltage applied to the gate electrode. By applying a suitable write signal to the gate electrode or to the gate electrode and the source line, charge may be injected in or removed from the floating body in accordance to a voltage supplied to the bit line. By applying a suitable read signal to the gate electrode or to the gate electrode and the source line, an output signal may be caused in the bit line, wherein the output signal depends on the amount and/or type of charge stored in the floating body region. Typically, the read signal differs from the write signal, for example with regard to the voltage amplitude.

When using a memory cell based on a thyristor structure, in which one memory state might be implemented by a forward blocking mode and another memory state might be implemented by a forward conduction mode, an additional access transistor is provided for each thyristor structure in order to ensure that only an addressed memory cell is read. Further on the forward conduction mode is held within the memory cell by a steady flowing current through the thyristor structure. A need exists for integrated circuits comprising a high density floating body memory cell array.

SUMMARY

An integrated circuit is provided comprising an array of memory cells connected by word and bit lines, respectively, wherein each memory cell comprises a thyristor structure, an anode terminal that connects the thyristor structure with a respective bit line, a gate terminal that connects the thyristor structure with a respective word line, and a cathode terminal. The integrated circuit further comprises a drive/sensing circuitry configured to apply a first sequence of voltage signals at the anode terminal and the gate terminal, wherein the voltage signals are defined with respect to the cathode terminal. The first sequence comprises a first voltage signal at the anode terminal, a second voltage signal at the gate terminal, and thereafter a combination of a third voltage signal at the anode terminal and a fourth voltage signal at the gate terminal, wherein the third voltage signal is lower than the first voltage signal and lower than the fourth voltage signal. The voltage signal at the gate terminal may be further reduced to a fifth voltage signal. The drive/sensing circuitry may be configured to apply one of at least two voltages as the fourth voltage signal, corresponding to different memory states to be written into the memory cell.

Further, a method for controlling a memory cell is disclosed, the memory cell comprising a thyristor structure with a body, a gate terminal, a cathode terminal and an anode terminal. The method comprises writing a first body potential of at least two different body potentials into the body, wherein the different body potentials are descriptive for different memory states, and reading the different body potentials by applying a combination of voltage signals at the terminals, wherein the combination of voltage signals is configured to trigger a thyristor structure with at least one of the different body potentials into a conducting mode.

BRIEF DESCRIPTION OF THE DRAWINGS

Features and advantages of embodiments of the invention will be apparent from the following description of the drawings. The drawings are not necessarily to scale. Emphasis is placed upon illustrating the principles.

DETAILED DESCRIPTION

Figure 1A:
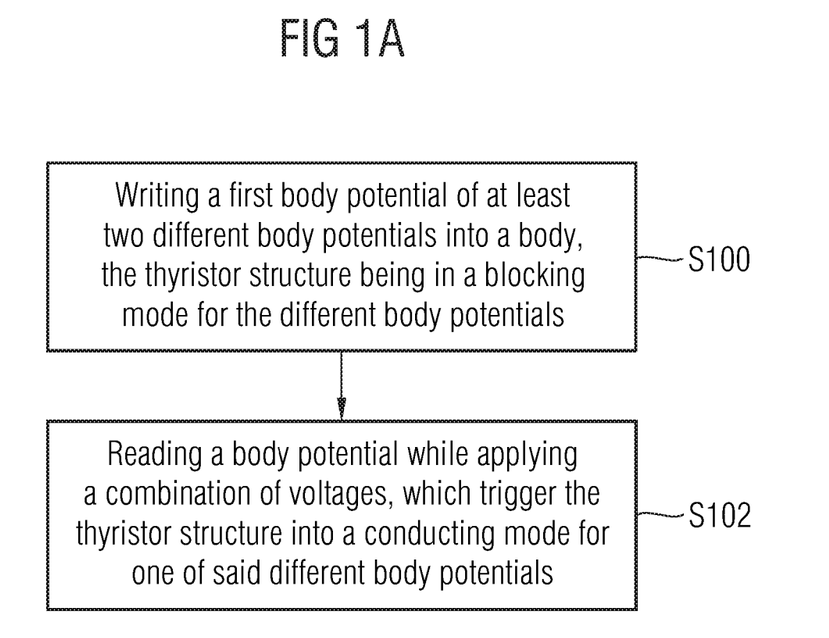
FIG. 1A is a simplified flow-chart illustrating a method for controlling an integrated circuit in accordance with an embodiment.
Figure 3:
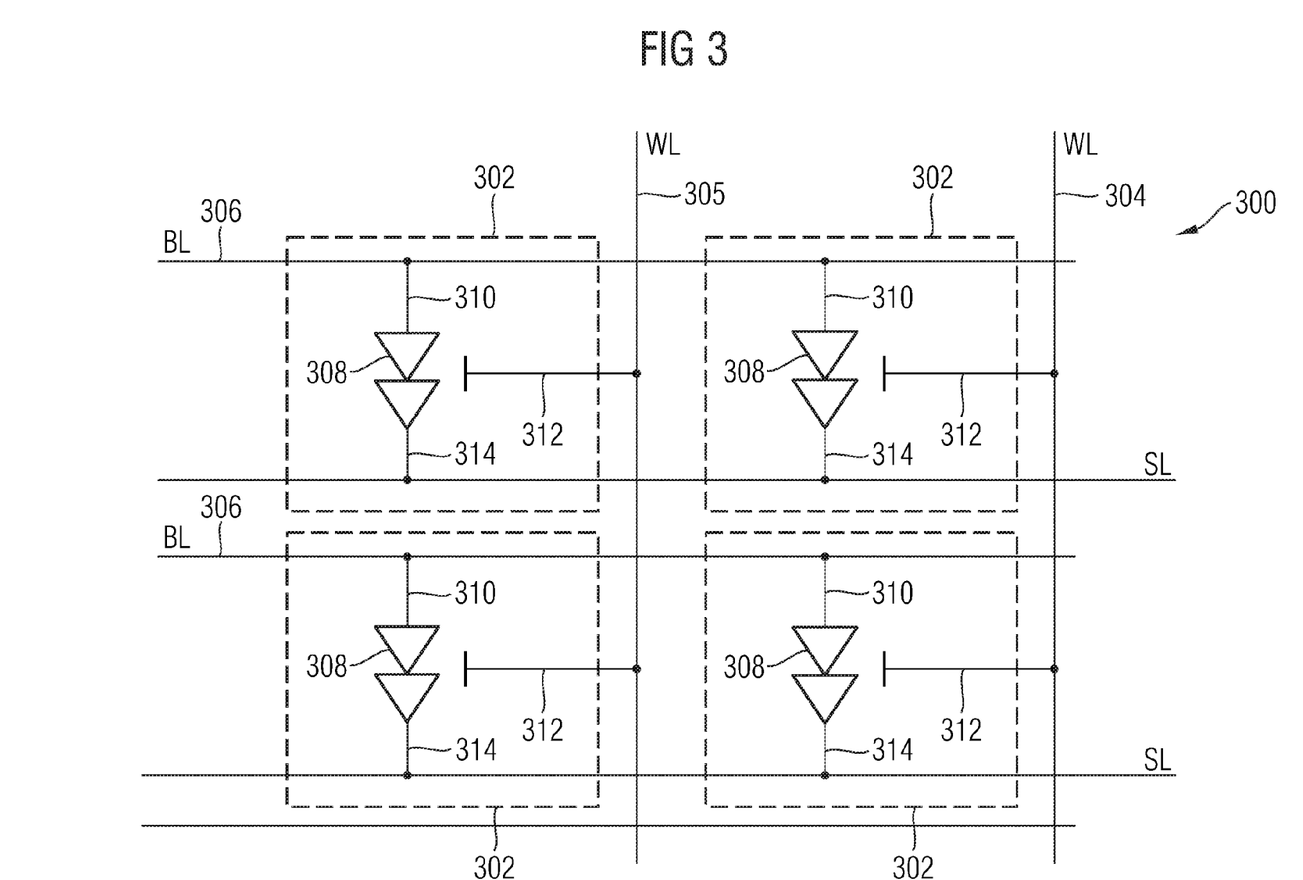
FIG. 3 is a schematic circuit diagram of a portion of an integrated circuit comprising a memory cell array according to an embodiment.

FIG. 1A shows a schematic flow-chart illustrating a method for controlling an array of memory cells, which is depicted schematically e.g. in FIG. 3.

In a step S100 a first body potential or charge state is written into a body of a thyristor structure, wherein the first body potential is one of at least two different body potentials, which are descriptive of two different memory states, wherein the thyristor structure is in a blocking mode for the different body potentials.

In a step S102 a body potential or charge state is read from the body of the thyristor structure by applying a voltage signal at the terminals of the thyristor structure that trigger the thyristor structure with at least one of the different body potentials into a conducting mode.

The at least two different body potentials might represent a logical "1" or a logical "0" in case the memory cell is used to store digital information.

Figure 2:
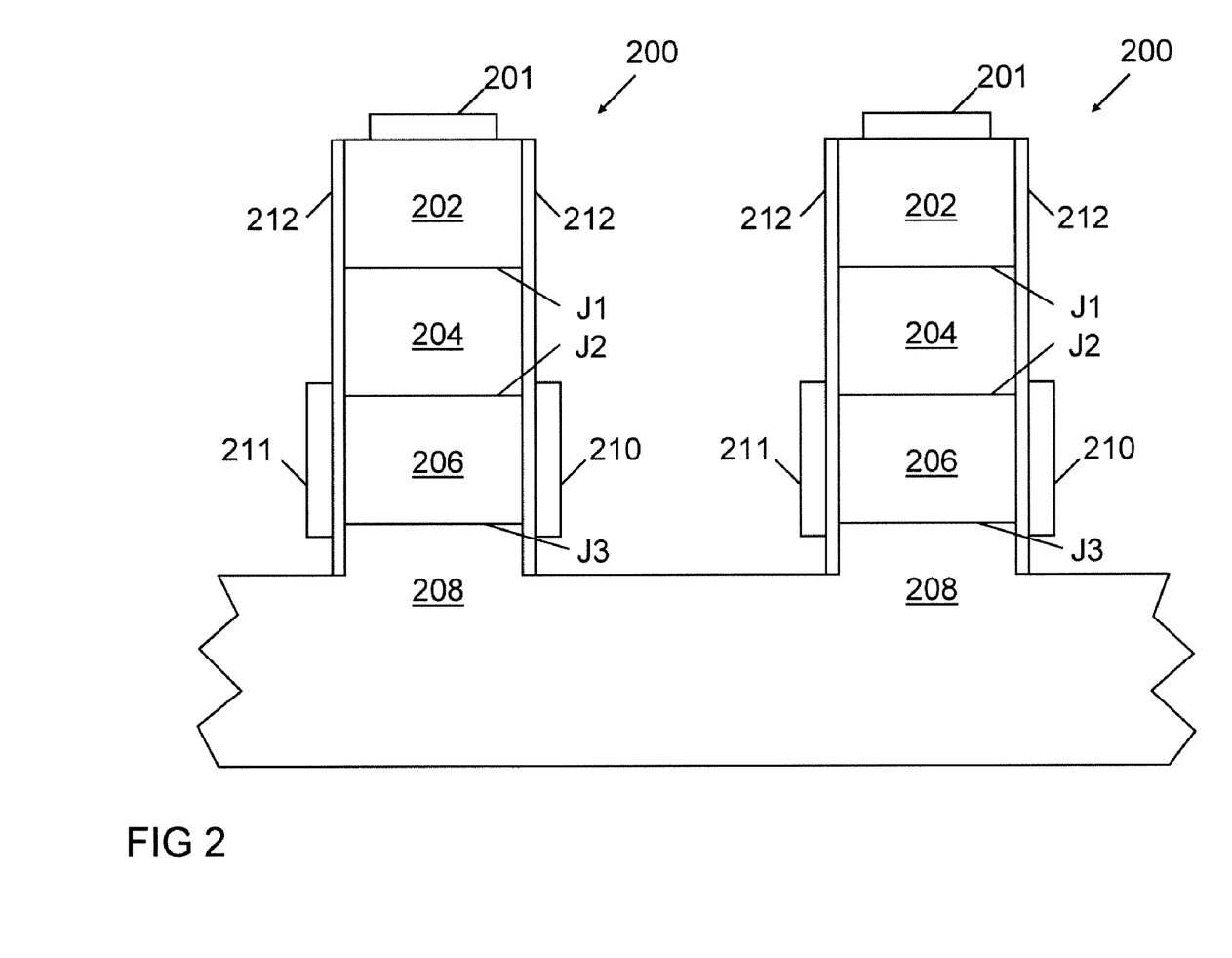
FIG. 2 is a schematic cross section through a floating-body transistor according to a further embodiment.
Figure 4:
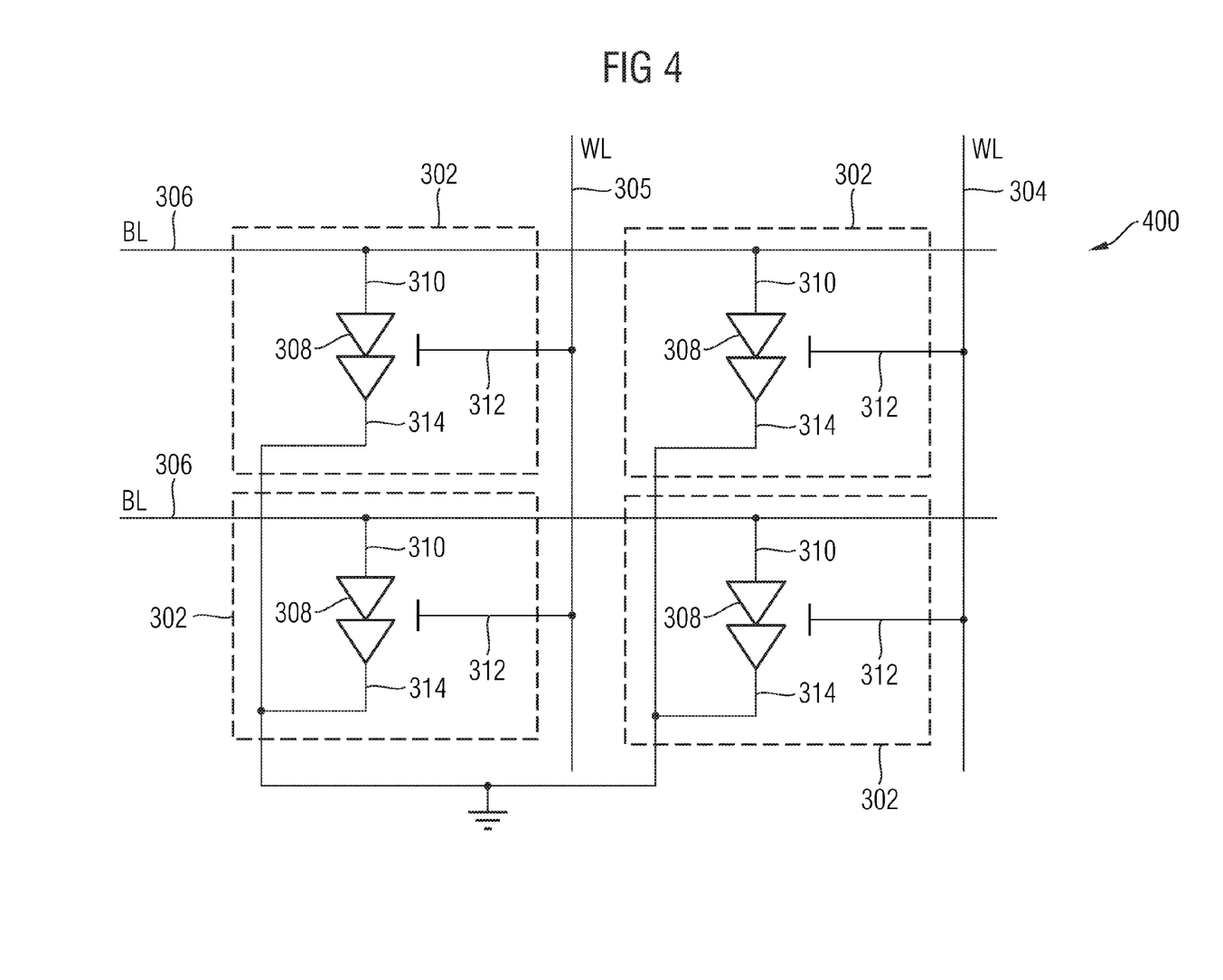
FIG. 4 is a schematic circuit diagram of a portion of an integrated circuit comprising a memory cell array according to a further embodiment.
Figure 5:
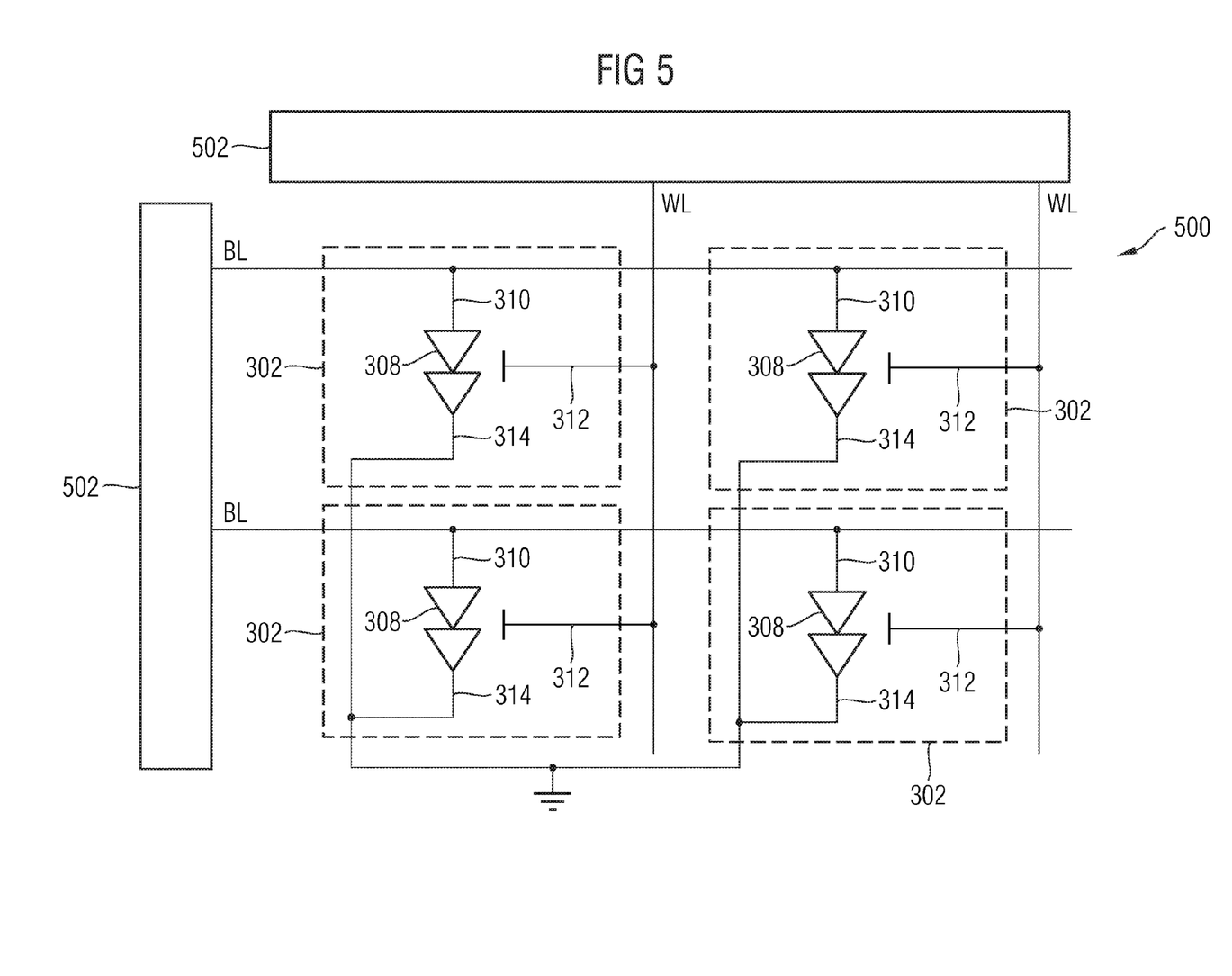
FIG. 5 is a schematic circuit diagram of a portion of an integrated circuit comprising a memory cell array according to a further embodiment.

The used wording of "blocking mode", "conduction mode" and "body potential" is now explained further in detail with respect to FIG. 2. In FIG. 2 a schematic cross-section through a Thin Capacitively Coupled Thyristor (TCCT) 200 as a thyristor structure is depicted. The thyristor 200 comprises an anode 202 with an anode contact 201, a floating n-doped region 204, a floating p-doped region 206 and a cathode 208. The thyristor 200 might be vertically structured, i.e. the anode 202 might be near the surface of an integrated circuit, and the n-doped region 204, the floating p-doped region 206 and the cathode 208 might be situated in lower regions of a semiconductor substrate. As it is depicted schematically in FIG. 2 the cathode 208 of different thyristor structures 200 in a memory array might be contacted, e.g. by being formed from a common semiconductor substrate. The depicted thyristor 200 comprises a first gate electrode 210 and a second gate electrode 211, which might be situated in the region of the p-doped region 206. In memory arrays as depicted in FIGS. 3-5, the gate electrode 210 might be connected to word lines. It is possible to use the second gate electrode 211 as a back gate electrode, which is not controlled by voltage signals on the word lines but kept on a constant voltage. It is also possible to control both the first gate electrode 210 and the second gate electrode 211 by voltage signals on the word line.

An insulator layer might be disposed between the p-doped region 206 and each of the two gate electrodes 210, 211. The insulator layer 212 might be silicon dioxide, silicon nitride or another suitable insulating material. It is also possible to use only the first gate electrode 210. The anode 202, the n-doped region 204, the floating p-doped region 206 and the cathode 208 might be based on silicon doped with respective p-dopants and n-dopants. The anode 202, the gate electrode 210 and the cathode 208 might also be referred to as first, second and third terminal of the thyristor 200, respectively.

Thyristors act as a switch, conducting when their gate receives a current pulse, and continue to conduct for as long as they are forward biased. As it is schematically depicted in FIG. 2 the thyristor 200 has three p-n-junctions (serially named J1, J2, J3 from the anode 202). The thyristor can be described having three states:
  1. Reverse blocking mode, when a voltage is applied between anode and cathode in a direction that current flow would be blocked by a diode J1 or J3.
  2. Forward blocking mode, when a voltage is applied between anode and cathode in a direction that current flow would be blocked by a diode J2 and the thyristor has not yet been triggered into conduction.
  3. Conducting mode, when a voltage is applied between anode and cathode in a direction that current flow would be blocked by a diode J2 but the thyristor has been triggered into conduction.

When the anode 202 is at a positive voltage with respect to the cathode 208 with low voltage applied at the gate 210, also referred as holding voltage, junctions J1 and J3 are forward biased, and junction J2 is reverse biased. As J2 is reverse biased, no conduction takes place (also referred to as "Off state" or "blocking mode"). If the voltage between anode 202 and cathode 208 is increased beyond a breakdown voltage of the thyristor 200, avalanche breakdown of J2 takes place and the thyristor 200 starts conducting (also referred to as "On-state" or "conducting mode"). If a more positive voltage signal is applied at the gate 210 with respect to the cathode 208, the breakdown of the junction J2 occurs at a lower value of the voltage between anode 202 and cathode 208. By selecting an appropriate value of the gate voltage, which depends e.g. on the work function of the used semiconductor material and the material of the first gate electrode 210, the thyristor 200 can be switched directly from forward blocking mode into the conducting mode.

The first body potential might be chosen so that the thyristor structure remains in the blocking mode, if only a voltage at the anode 202 is applied. Since the change from the blocking mode to the conduction mode might be not instantaneous, it is also possible to use a first body potential and a voltage at the anode 202, which would result in a change to the conduction mode after a corresponding time interval, but switching off the voltage at the anode 202 before the end of the time interval is reached.

It should be noted that once avalanche breakdown has occurred, the thyristor 200 continues to conduct, irrespective of the gate voltage, until the voltage between anode and cathode is lowered, thus the current through the thyristor 200 from anode 202 to cathode 208 becomes less than a predetermined holding current.

While using a vertically structured TCCT 200 as depicted in FIG. 2 the cathode 208 might be easily connected to cathodes of other vertically structured TCCTs by realizing the cathodes as a contiguous buried well or as source lines in the semiconductor substrate.

Figure 1B:
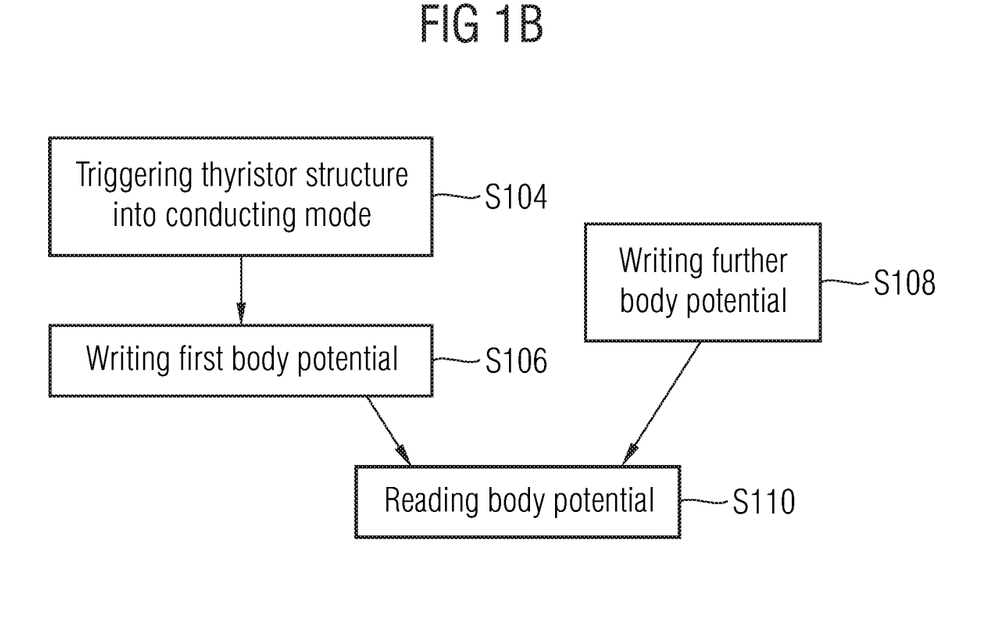
FIG. 1B is a simplified flow-chart illustrating a method for controlling an integrated circuit in accordance with a further embodiment.

In FIG. 1B a simplified flow-chart for a method according to a further embodiment is depicted. Therein it is shown that in a step S104 the thyristor structure is triggered into a conducting mode and afterwards in a step S106 the first body potential is written into the body, e.g. by a applying corresponding voltage signals at terminals of the thyristor structure. Further on it is specified that it is also possible to write a further body potential into the body of the thyristor structure in a step S108 by applying a further combination of voltage signals at the terminals. Within a step S110 of reading the body potentials, the combination of voltage signals that is applied to the terminals of the thyristor structure is chosen to trigger the thyristor structure into a conducting mode, if the first body potential has been written into the thyristor structure beforehand.

However, the combination of voltage signals is not configured to trigger the thyristor structure into a conducting mode, if only the further body potential has been written into the thyristor structure beforehand, which therefore remains in the blocking mode. Thus, when reading the memory cell, while applying the combination of voltage signals, it can be distinguished between the different body potentials which have been written beforehand into the thyristor structure.

In an embodiment the combination of voltage signals for reading a memory cell comprise at least a voltage different from the holding voltage between the gate electrode 210 and the cathode 208. In case the gate electrode 210 is at the p-region 206, the voltage at the gate electrode 210 is more positive than the holding voltage, in case the gate electrode is at the n-region 204 the voltage at the gate electrode 210 is more negative than the holding voltage.

Therefore, the different body potentials might serve as indicators for different memory states, e.g. a logical "0" and a logical "1".

In FIG. 3 a schematic circuit diagram of an integrated circuit 300 comprising an array of memory cells 302 is depicted. The memory cells 302 are connected by word lines WL, 304, 305 and bit lines BL, 306. Each of the memory cells 302 includes a thyristor structure 308 with a body and further includes a first terminal 310, a second terminal 312 and a third terminal 314. The first terminal 310 connects the thyristor structure 308 with a respective bit line 306, the second terminal connects the thyristor structure 308 with a respective word line 304 and the third terminal 314 connects the thyristor structure 308 with a third terminal 314 of a second memory cell 302 of a word line 305 other than the respective word line 304, e.g. via a source line SL.

With the proposed array of memory cells a cross-point-cell layout is achieved, which allows a reduction of the area of a memory cell towards $4F^2$ (F being the smallest possible structure width). A capacitor less DRAM is less complex to manufacture and a terminal to a capacitor is not needed, thereby further reducing the area of the memory cell.

In FIG. 4 a schematic circuit diagram of an integrated circuit 400 comprising an array of memory cells 402 according to a further embodiment is depicted. The memory cells 402 comprise a thyristor structure 308, a first terminal 310, a second terminal 312 and a third terminal 314 as in the embodiment of FIG. 3. However, the third terminals 314 of each memory cell 302 are connected together, and might be connected to a common potential, e.g. ground as it is depicted here. Thus, a further reduction of manufacturing complexity is achieved.

In FIG. 5 a schematic circuit diagram of an integrated circuit 500 comprising an array of memory cells 302 according to a further embodiment is depicted. The memory cells 302 each comprise a thyristor structure 308 and a first terminal 310, a second terminal 312 and a third terminal 314 as within the embodiments of FIG. 3 and FIG. 4. In addition the integrated circuit 500 comprises a drive/sense circuitry 502 which is configured to control the memory cells 302 in accordance with the method steps described in FIGS. 1A and 1B.

Figure 6:
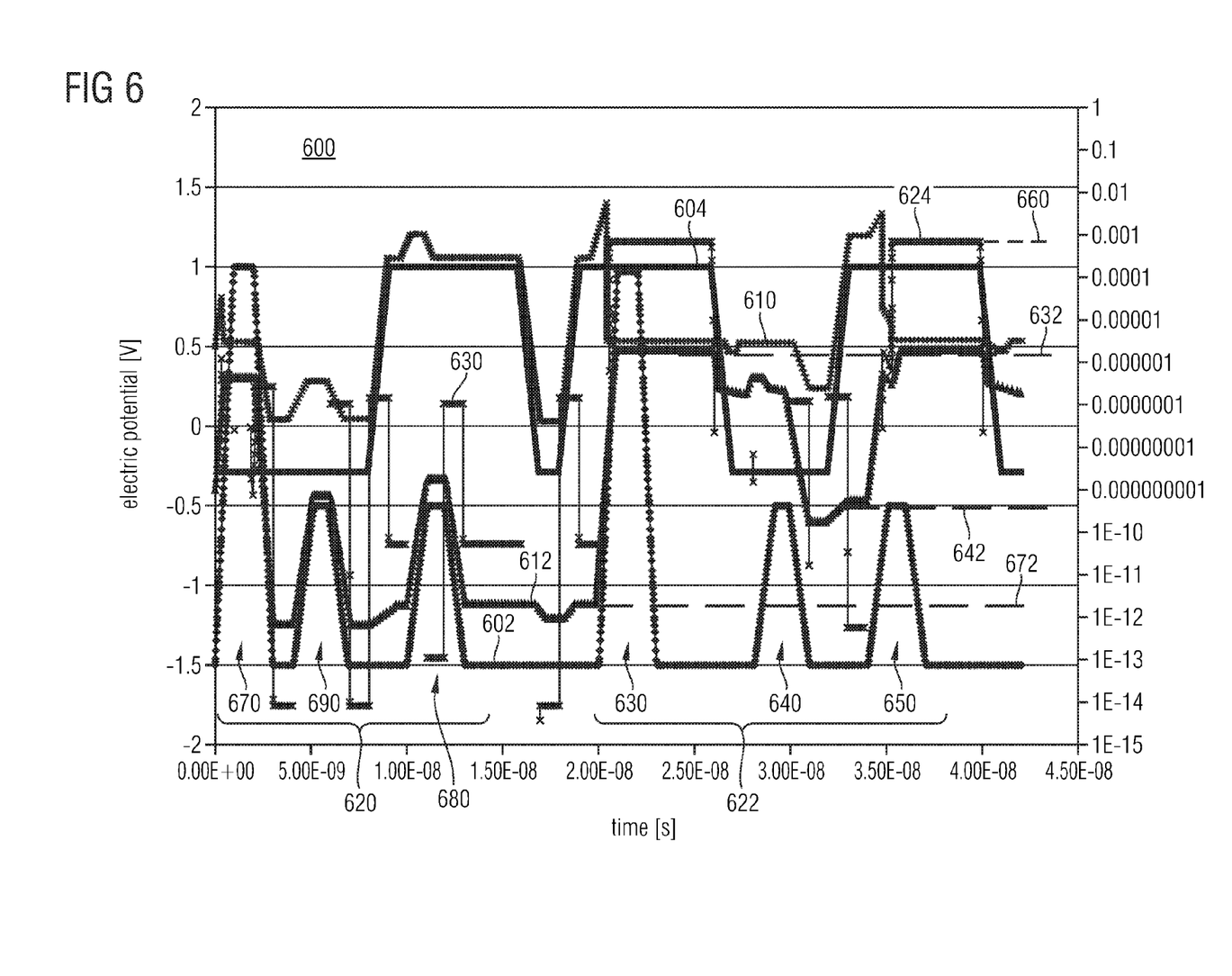
FIG. 6 is a schematic diagram illustrating a method for controlling an integrated circuit in accordance with a further embodiment.

In FIG. 6 a schematic time diagram 600 of the word line voltage signals 602 and the bit line voltage signals 604, applied to the first, second and third terminals, respectively, the resulting changes of the potentials 610, 612 within the n-region 504 and the p-region 506, respectively, of the TCCT 500 of FIG. 5 and the resulting anode current 624 for writing and reading different body potentials is depicted. The voltages used are only examples, persons having ordinary skill in the art might develop other voltages working in the same way.

In the time diagram 600 a first pulse sequence 620 for writing and reading a logical "0" is depicted and afterwards a second pulse sequence 622 for writing and reading a logical "1". In the following the voltage signals are defined with respect to the cathode voltage, which might be equal to the ground voltage as depicted in FIG. 3. For instance, the bit line voltage signal 604 is applied to the bit line, i.e. it describes the voltage between the anode 202 and the cathode 208.

When comparing with the embodiments in FIGS. 3 to 5 a terminal of the anode 202 corresponds to the first terminal 310 and a terminal of the cathode 208 corresponds to the third terminal 314. The word line voltage signal 602 is applied to the word line, i.e. between the gate 210, which corresponds to the second terminal 312, and the cathode 208.

In case a first combination of voltage signals, i.e. a positive voltage of e.g. 1V at the word line and a positive voltage of e.g. 1V at the bit line, is applied as a writing pulse 630, the body potential 612 within the p-region 506 is increased to a first value 632, as long as a current is flowing. After the current is no longer flowing the body potential 612 is reduced to a second value 633, due to recombination effects.

With a second combination of voltage signals of a word line voltage of e.g. −0.5V and a bit line voltage of e.g. −0.3V as a reducing pulse 640 the body potential 612 within the p-region 506 is reduced to a third value 642. This third value 642 might correspond to the first body potential mentioned above. In case a reading voltage signal combination of a word line voltage of e.g. −0.5V and of a bit line voltage of e.g. 1V is used as a reading pulse 650, the body potential 612 is increased again to the first value 632 and a high anode current 660 is obtained, indicating a stored logical "1" within the body of the TCCT-DRAM. The voltage of the word line for the second combination of voltage signals and for the reading voltage signal combination is chosen to be below the threshold voltage of the transistor within the thyristor, which might be around 0V.

The voltage at the gate electrode might be chosen the same for the combination of voltage signals for reading and for the second combination of voltages for reducing the body potentials, thus, no further, different voltage signal has to be provided on the integrated circuit.

When applying a third combination of voltage signals during a further writing pulse 670, which writes a logical "0" into the body, a positive voltage of e.g. 1V is applied to the word line and a negative voltage of e.g. −0.3V is applied to the bit line. During the pulse 670 the body potential 612 within the p-region 506 increases but after the pulse 670 has been finished, the body potential 612 within the body is reduced to a fourth value 672, which corresponds to the further body potential mentioned above, e.g. used for storing a logical "0".

When a reading voltage signal combination for a further reading pulse 680, which is the same as for the reading pulse 650, of e.g. −0.5 V at the word line together with a positive voltage of e.g. 1V at the bit line, is applied only a low anode current 685 is measured, thus indicating the logical "0" which is stored within the body of the TCCT-DRAM.

The second combination of voltage signals has no effect in case a logical "0" is written into the body. This is shown by applying the second combination in a disturbing pulse 690 of the first pulse sequence 601. After the disturbing pulse 690 is finished the body potential 612 still corresponds to the fourth value 672.

Thus, with the proposed voltage signal combination a TCCT-DRAM can be controlled with only two lines, a bit line and a word line. The cathode terminals of different memory cells might be connected together, e.g. to a common plane, because a read or write operation to a selected memory cell might be performed without applying a different voltage to the cathode terminal of the respective memory cell and to cathode terminals of other memory cells, respectively.

Since only a bit line and a word line is used for controlling the TCCT-DRAM with the proposed method, the space needed for one memory cell array might be further reduced in order to achieve a so-called cross-point-cell layout, which allows a reduction of the area of a memory cell to $4F^2$ (F being the smallest possible structure width).

With the proposed method the body potential within a thyristor structure is reduced after a logical "1" has been written. Thus, the thyristor is not in a forward conduction mode, but in a blocking mode. A further voltage signal at the word line and the bit line is applied while reading, which is sufficient to trigger on a TCCT-DRAM with a reduced body potential but is not sufficient to trigger on a TCCT-DRAM with a body potential corresponding to a logical "0". Therefore, a high anode current indicating a stored logical "1" is achieved, when the body potential corresponds to the first body potential (third value 642) and a low anode current, corresponding to a logical "0" is achieved, when the body potential corresponds to the fourth value 672.

It is also possible to reduce the word line voltage signal 604 so slowly that the potential 612 in the body can follow up to the third value 642. With this embodiment no second voltage signal combination is used but the falling slope of the word line voltage signal 604 in order to reduce the body potential within the body of the TCCT-DRAM.

When writing one of a plurality of different body potentials into the body of a thyristor structure and choosing appropriate combinations of voltages for reading the different body potentials, it is also possible to use the thyristor structure for storing more than two states.

Figure 7:
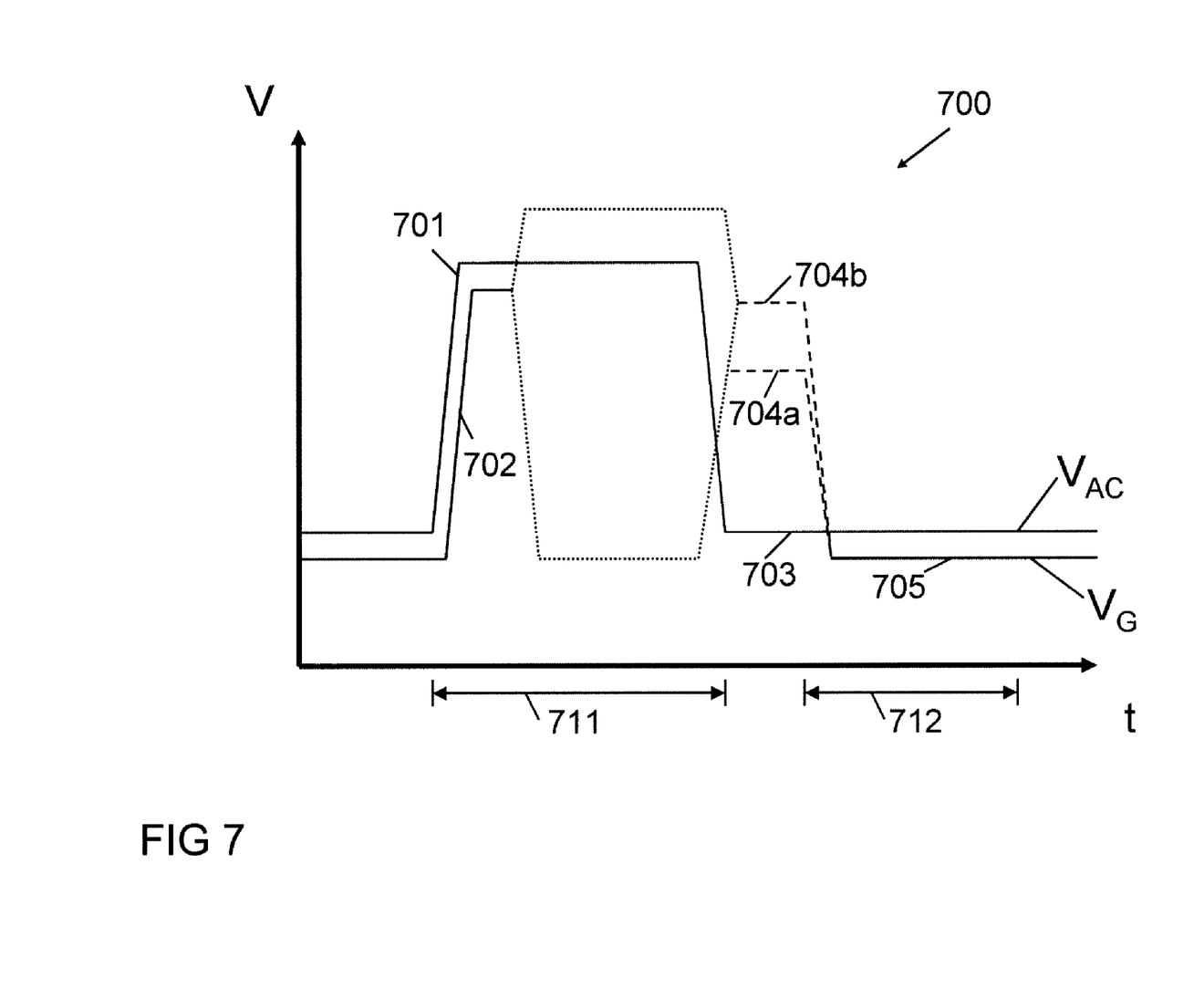
FIG. 7 is a schematic timing sequence for applying voltage signals according to a further embodiment.

In FIG. 7 a schematic timing sequence 700 for voltage signals $V_{AC}$ at the anode terminal and for voltage signals $V_G$ at the gate terminal according to a further embodiment is depicted. The drive/sensing circuitry 502 might apply a first sequence of voltage signals at the anode terminal and the gate terminal, wherein the voltage signals are defined with respect to the cathode terminal, the first sequence including at least: a first voltage signal 701 at the anode terminal, a second voltage signal 702 at the gate terminal, and thereafter a combination of a third voltage signal 703 at the anode terminal and a fourth voltage signal 704a, 704b at the gate terminal, wherein the third voltage signal 703 is lower than the first voltage signal 701 and lower than the fourth voltage signal 704a, 704b.

The first voltage signal 701 and the second 702 voltage might be applied in a first joint phase 711 and the third voltage signal 703 and the fourth voltage signal 704a, 704b might be applied in a second joint phase 712 after the first joint phase 711.

The first sequence might further include a fifth voltage signal 705, which is applied at the gate terminal after the fourth voltage signal 704a, 704b, the fifth voltage signal 705 being lower than the fourth voltage signal 704. The transition from the fourth voltage 704a, 704b to the fifth voltage 705 occurs within the second joint phase 712 for this embodiment.

The drive/sensing circuitry might be configured to write different memory states into the memory cell by applying different sequences, wherein different fourth voltage signals 704a, 704b at the gate terminal are selected in the different sequences, corresponding to the different memory states. For instance, one of the fourth voltage signals might be a fourth voltage signal 704a, which corresponds to a voltage signal to write a logical "1" into the memory cell and a further fourth voltage signal 704b might correspond to a voltage signal to write a logical "0" into the memory cell.

A reading circuit might be provided as part of the drive/sensing circuitry configured to distinguish between the different memory states.

As it is depicted in FIG. 7 the voltage signals $V_G$ at the gate terminal might decrease monotonously from the fourth voltage signal 704a, 704b to the fifth voltage signal 705. It has been found that the voltage drop from the fourth voltage signal 704a, 704b to the fifth voltage signal 705 may be used to define the body potential at the end of the second joint phase 712, thereby allowing to trigger the thyristor structure into one of at least two body potential states via the amount of the voltage drop, for example by selecting one of the two different values of the fourth voltage signals 704a and 704b.

The third voltage signal 703 might be equal to zero.

Figure 8:
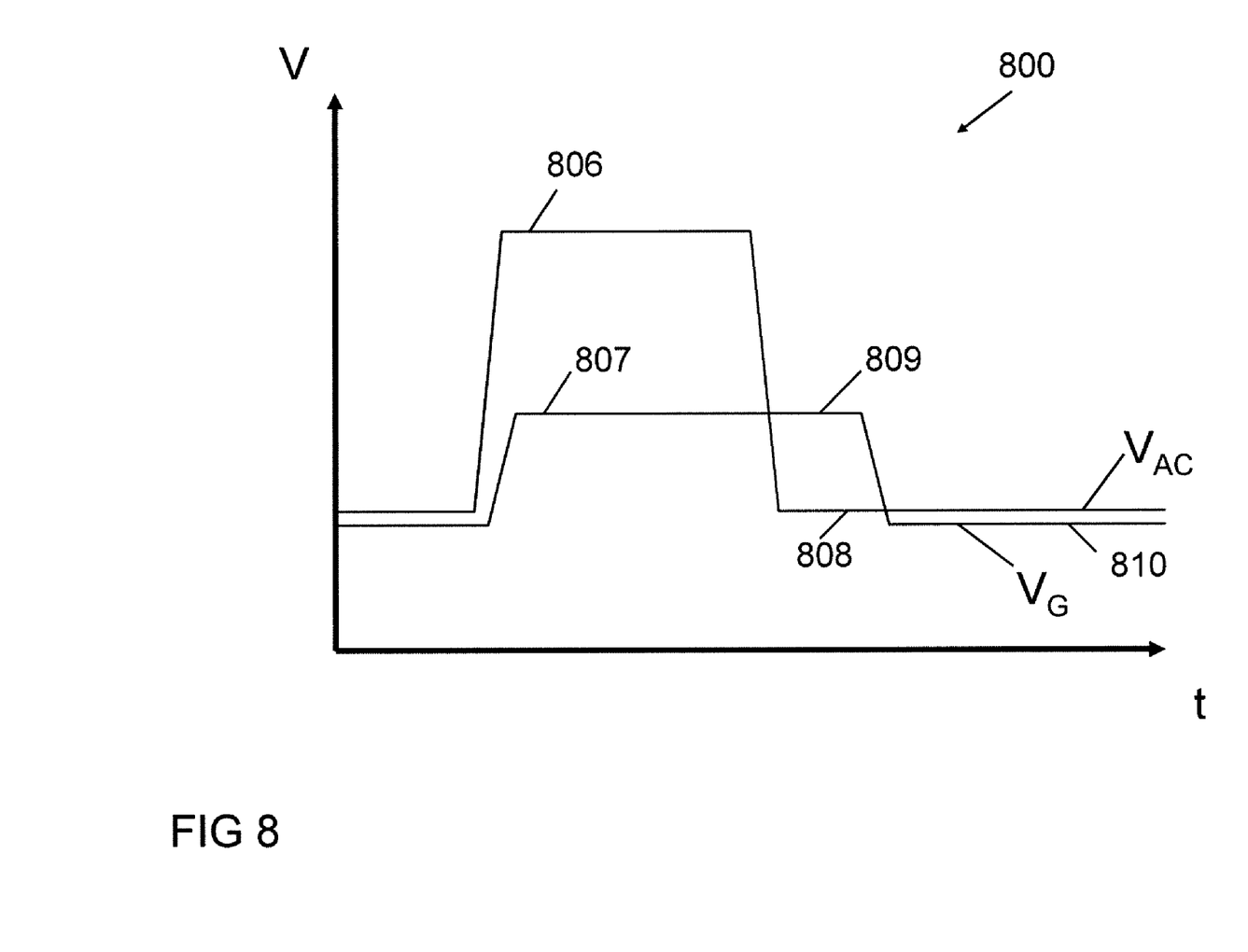
FIG. 8 is a schematic timing sequence for applying voltage signals according to a further embodiment.

In FIG. 8 a further timing sequence 800 is depicted which might be used to refresh a memory. A refresh circuitry might be provided e.g. as part of the drive/sensing circuitry 502 in order to apply a second sequence of voltages, the second sequence including at least: a sixth voltage signal 806 at the anode terminal; a seventh voltage signal 807 at the gate terminal; a combination of an eighth voltage signal 808 at the anode terminal and a ninth voltage signal 809 at the gate terminal, wherein the eighth voltage signal 808 is lower than the sixth voltage signal 806 and lower than the ninth voltage signal 809, and thereafter a tenth voltage signal 810, which is lower than the ninth voltage signal 809, at the gate terminal. With this second sequence of voltage signals, which might be applied of the whole array of memory cells, a first subset of memory cells with one of the at least two body potential states might be triggered into the conducting mode by applying the sixth voltage signal 806 and the seventh voltage signal 807, while a second subset of memory cells with another one of the at least two body potential states might remain in blocking mode. The second sequence of voltage signals may therefore be chosen to selectively modify the body potential state of one of the subset of memory cells with respect to the other subset, thereby allowing to increase the difference of the body potentials between both subsets (e.g. the difference between the average body potentials in both subsets). As a consequence, the body potential states of the two subsets of memory cells may be more reliably distinguishable by the drive/sensing circuitry after applying the second sequence of voltage signals 800, thereby refreshing the memory cells. At the end of the second sequence of voltage signals 800, the thyristor structure is in blocking mode again.

The seventh voltage signal 807 might be equal to the ninth voltage signal 809.

The foregoing description was based on a TCCT-DRAM with the anode representing the first terminal connected to the bit line and the cathode representing the third terminal. However, as it is easily apparent it is also possible to use the cathode as the first terminal connected to the bit line and the anode as the third terminal. In addition it should be noted that while the embodiment of FIG. 5 was based on a gate 510 at the p-region 506, it is also possible to situate the gate at the n-region. It is also possible to provide gates at the n-region and the p-region. In the embodiment of FIG. 2 a further gate electrode at the n-region 204 might be controlled in order to better shield the p-region 206 for better holding the body-potential written therein.

The voltage signals for reading and writing memory cells based on a TCCT (also referred to as TCCT-DRAM) are lower than for a capacitor-less RAM based on a usage of the effect of impact ionization and might be below 1V. Due to the lower voltage signals the TCCT could provide a superior retention.

What is claimed is:

1. A method for controlling a memory cell with a thyristor structure including a body, a first terminal connected to a respective bit line, and a second terminal connected to a respective word line, the method comprising:

writing the memory cell by setting the body to a first body potential of at least two different body potentials, wherein the thyristor structure is in a blocking mode with each of the different body potentials and the different body potentials are descriptive for respective different memory states; and reading the memory cell by applying a combination of voltage signals at the terminals, wherein the combination of voltage signals is configured to trigger the corresponding thyristor structure into a conducting mode or a blocking mode depending on the body potential of the corresponding thyristor structure.

2. The method according to claim 1, wherein the thyristor structure with the first body potential is not triggered into the conducting mode if only a voltage value at the first terminal is applied.

3. A method for controlling a memory cell with a thyristor structure including a body, a first terminal connected to a respective bit line, and a second terminal connected to a respective word line, the method comprising:

writing the memory cell by setting the body to a first body potential of at least two different body potentials, wherein the thyristor structure is in a blocking mode with the different body potentials and the different body potentials are descriptive for different memory states, wherein writing the first body potential comprises triggering the thyristor structure into the conducting mode, and afterwards reducing a body potential of the body in the conducting mode to the first body potential; and reading the memory cell by applying a combination of voltage signals at the terminals, wherein the combination of voltage signals is configured to trigger the corresponding thyristor structure into a conducting mode or a blocking mode depending on the body potential of the corresponding thyristor structure.

4. The method according to claim 3, wherein the thyristor structure with the first body potential is triggered to the conducting mode during reading of the memory cell.

5. The method according to claim 3, wherein the first terminal is an anode terminal and the second terminal is a gate terminal of the thyristor structure, the method further comprising:

writing a further body potential by applying voltages at the anode terminal and the gate terminal that do not trigger the thyristor structure into the conducting mode, wherein the voltages are defined with respect to the cathode terminal.

6. A method for controlling a memory cell, the memory cell comprising a thyristor structure with a body, a gate terminal, a cathode terminal and an anode terminal, the method comprising:

writing a first body potential of at least two different body potentials into the body, wherein the different body potentials are descriptive for different memory states; and reading the different body potentials by applying a combination of voltage signals at the terminals, wherein the combination of voltage signals is configured to trigger a thyristor structure with at least one of the different body potentials into a conducting mode, wherein the thyristor structure with the first body potential is not triggered into the conducting mode if only a voltage value at the first terminal is applied.

7. A method for controlling a memory cell, the memory cell comprising a thyristor structure with a body, a gate terminal, a cathode terminal and an anode terminal, the method comprising:

writing a first body potential of at least two different body potentials into the body, wherein the different body potentials are descriptive for different memory states, wherein writing the first body potential comprises triggering the thyristor structure into the conducting mode, and then reducing a body potential of the body in the conducting mode to the first body potential; and reading the different body potentials by applying a combination of voltage signals at the terminals, wherein the combination of voltage signals is configured to trigger a thyristor structure with at least one of the different body potentials into a conducting mode.

8. The method according to claim 7, wherein the thyristor structure with the first body potential is triggered to the conducting mode during the step of reading.

* * * * *